United States Patent
Bhatia et al.

(10) Patent No.: US 10,884,858 B2
(45) Date of Patent: Jan. 5, 2021

(54) LDPC DECODING DEVICE, MEMORY SYSTEM INCLUDING THE SAME AND METHOD THEREOF

(71) Applicant: SK HYNIX INC., Gyeonggi-do (KR)

(72) Inventors: Aman Bhatia, San Jose, CA (US); Naveen Kumar, San Jose, CA (US); Chenrong Xiong, San Jose, CA (US); Abhiram Prabhakar, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/355,296

(22) Filed: Mar. 15, 2019

(65) Prior Publication Data
US 2019/0286522 A1 Sep. 19, 2019

Related U.S. Application Data

(60) Provisional application No. 62/643,967, filed on Mar. 16, 2018.

(51) Int. Cl.
*G06F 11/10* (2006.01)
*H03M 13/11* (2006.01)
*H04L 1/00* (2006.01)

(52) U.S. Cl.
CPC ..... *G06F 11/1076* (2013.01); *H03M 13/1137* (2013.01); *H04L 1/0057* (2013.01)

(58) Field of Classification Search
CPC .................................................. G06F 11/1076
USPC ........................................................ 714/804
See application file for complete search history.

(56) References Cited

U.S. PATENT DOCUMENTS

| | | | |
|---|---|---|---|
| 7,035,285 B2* | 4/2006 | Holloway | H04L 1/0003 370/474 |
| 7,502,982 B2 | 3/2009 | Silvus et al. | |
| 8,069,397 B2* | 11/2011 | Vityaev | G11B 20/10009 714/755 |
| 8,621,318 B1 | 12/2013 | Micheloni et al. | |
| 9,092,353 B1 | 7/2015 | Micheloni et al. | |
| 9,565,581 B2 | 2/2017 | Zhang et al. | |
| 9,614,548 B1 | 4/2017 | Nguyen et al. | |
| 9,842,020 B2* | 12/2017 | Sengoku | H03M 13/03 |
| 10,164,656 B2 | 12/2018 | Yang et al. | |
| 2004/0134988 A1* | 7/2004 | Pettinelli, Jr. | H03M 1/182 235/462.25 |
| 2005/0041746 A1* | 2/2005 | Rosen | H04B 1/7163 375/242 |
| 2009/0282319 A1 | 11/2009 | No et al. | |
| 2013/0046958 A1 | 2/2013 | Zhang et al. | |
| 2014/0223256 A1 | 8/2014 | Sakai et al. | |
| 2014/0313610 A1 | 10/2014 | Zhang et al. | |

(Continued)

OTHER PUBLICATIONS

Jinghu Chen and Marc Fossorier, Near optimum universal belief propagation based decoding of low-density parity check codes, IEEE Transactions on Communications, vol. 50, No. 3, Mar. 2002.

*Primary Examiner* — Fritz Alphonse
(74) *Attorney, Agent, or Firm* — IP & T Group LLP

(57) ABSTRACT

A low density parity check (LDPC) decoding device includes a data generator for generating information with a first precision; a data converter for converting the information into a message with a second precision greater than the first precision; and a decoding processor for performing a low density parity check (LDPC) decoding using the message to generate decoded data.

18 Claims, 14 Drawing Sheets

(56) References Cited

U.S. PATENT DOCUMENTS

2015/0263761 A1 9/2015 Varnica et al.
2016/0274971 A1 9/2016 Kang et al.
2017/0125114 A1 5/2017 Alhussien et al.
2017/0168894 A1 6/2017 Kim et al.
2017/0310342 A1 10/2017 Yen et al.
2018/0013450 A1 1/2018 Hsiao et al.
2018/0293131 A1 10/2018 Lin et al.
2019/0149168 A1 5/2019 Chang et al.

* cited by examiner

FIG. 7B

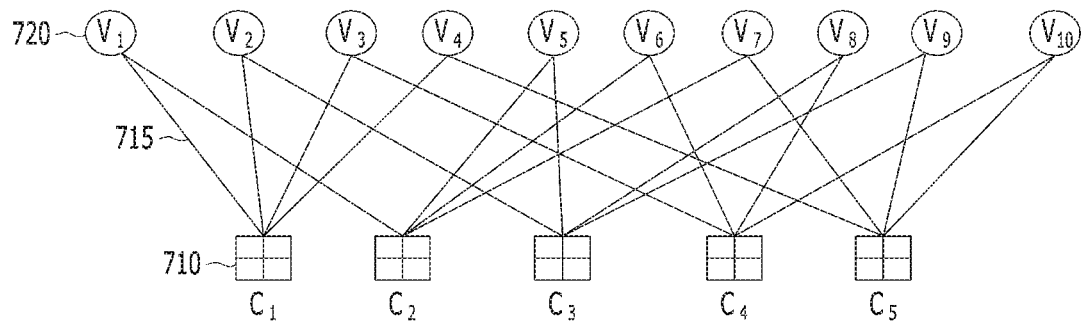

FIG. 7C

- After 1 iteration
$\underline{v} = (0 \quad 1 \quad 1 \quad 0 \quad 1 \quad 0 \quad 0 \quad 0 \quad 1 \quad 1)$ $$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 0 \\ 0 \\ 0 \end{pmatrix} \neq \underline{0} \longrightarrow \text{Perform next iteration}$$

Syndrome check

LDPC DECODING DEVICE, MEMORY SYSTEM INCLUDING THE SAME AND METHOD THEREOF

CROSS-REFERENCE TO RELATED APPLICATION(S)

This application claims the benefit of U.S. Provisional Application No. 62/643,967, filed on Mar. 16, 2018, the entire contents of which are incorporated herein by reference.

BACKGROUND

1. Field

Embodiments of the present disclosure relate to a decoding scheme for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, a data storage device. The data storage device is used as a main memory device or an auxiliary memory device of the portable electronic devices.

Memory systems using memory devices provide excellent stability, durability, high information access speed, and low power consumption, since they have no moving parts. Examples of data storage devices having such advantages include universal serial bus (USB) memory devices, memory cards having various interfaces, and solid state drives (SSDs). Various encoding and decoding schemes may be used in memory systems.

SUMMARY

Various embodiments are directed to a low density parity check (LDPC) decoding device for memory systems and an operating method thereof.

In accordance with an embodiment, a decoding device includes a data generator for generating information with a first precision; a data converter for converting the information into a message with a second precision greater than the first precision; and a decoding processor for performing a low density parity check (LDPC) decoding using the message to generate decoded data.

In accordance with an embodiment, a memory system includes a memory device and a memory controller for controlling the memory device to perform a read operation. The memory controller includes a decoding device including: a data generator for receiving data read from the memory device and generating soft decision data for the read data, the soft decision data with a first precision; a data converter for converting the soft decision data into a message with a second precision greater than the first precision; and a decoding processor for performing a low density probability check (LDPC) decoding using the message to generate decoded data.

In accordance with an embodiment, a method for operating a memory system including a memory device and a memory controller suitable for controlling the memory device to perform a read operation. The method includes receiving data read from the memory device; generating soft decision data for the read data, the soft decision data with a first precision; converting the soft decision data into a message with a second precision greater than the first precision; and performing a low density probability check (LDPC) decoding using the message to generate decoded data.

BRIEF DESCRIPTION OF THE DRAWINGS

FIG. 7B is a diagram illustrating a structure of a low density parity check (LDPC) code.

FIG. 7C is a diagram illustrating a syndrome check process according to a low density parity check (LDPC) decoding.

DETAILED DESCRIPTION

Figure 1A:
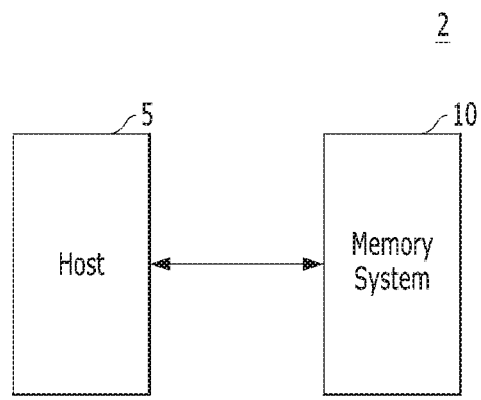
FIG. 1A is a block diagram illustrating a data processing system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like does not necessarily mean only one embodiment, and different references to any such phrases is not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example; the invention may be practiced according to the claims without some or all of these specific details. For clarity, technical material that is known in the technical fields related to the invention has not been described in detail so that the invention is not unnecessarily obscured.

FIG. 1A is a block diagram illustrating a data processing system 2 in accordance with an embodiment of the present invention.

Referring FIG. 1A, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 1B:
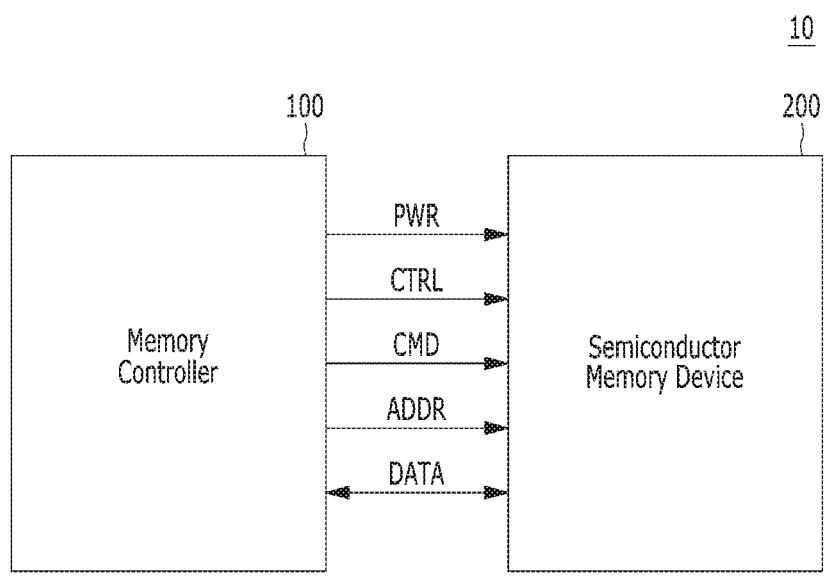
FIG. 1B is a block diagram illustrating a memory system in accordance with an embodiment of the present invention.

FIG. 1B is a block diagram illustrating a memory system 10 in accordance with an embodiment of the present invention.

Referring FIG. 1B, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1A) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
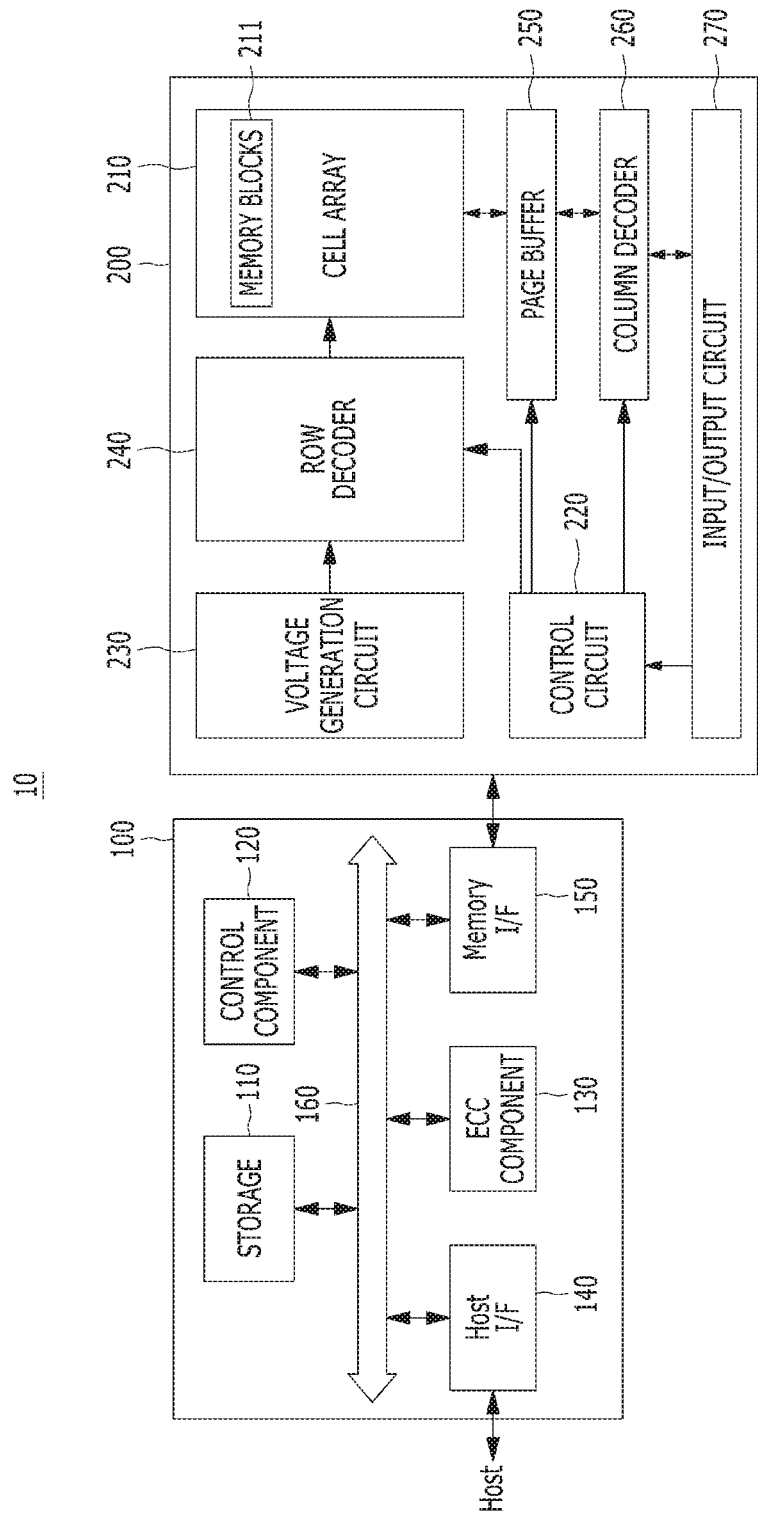
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIGS. 1A and 1B.

Referring to FIG. 2, the memory system 10 may include a memory controller 100 and a semiconductor memory device 200. The memory system 10 may operate in response to a request from a host device (e.g., host device 5 of FIG. 1A), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
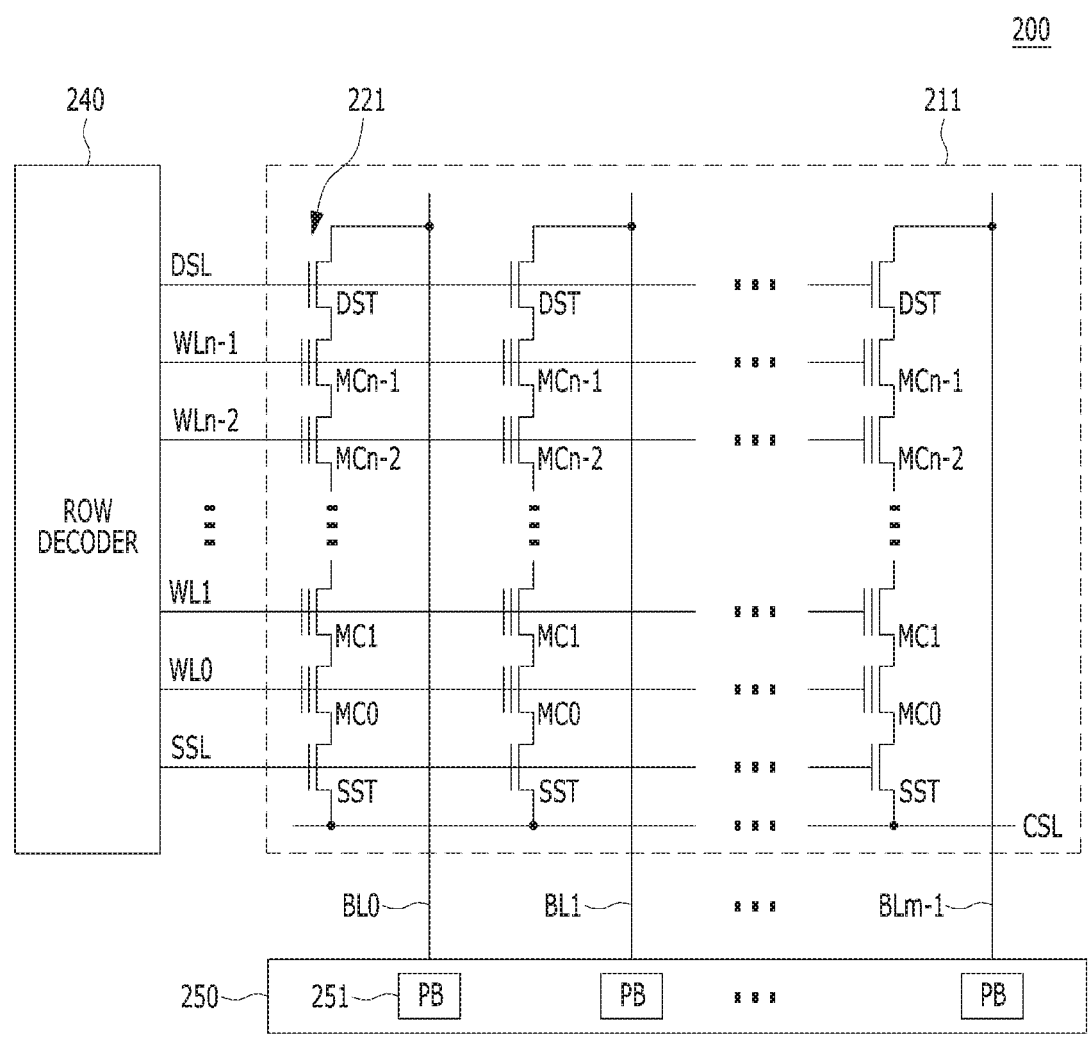
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1B), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
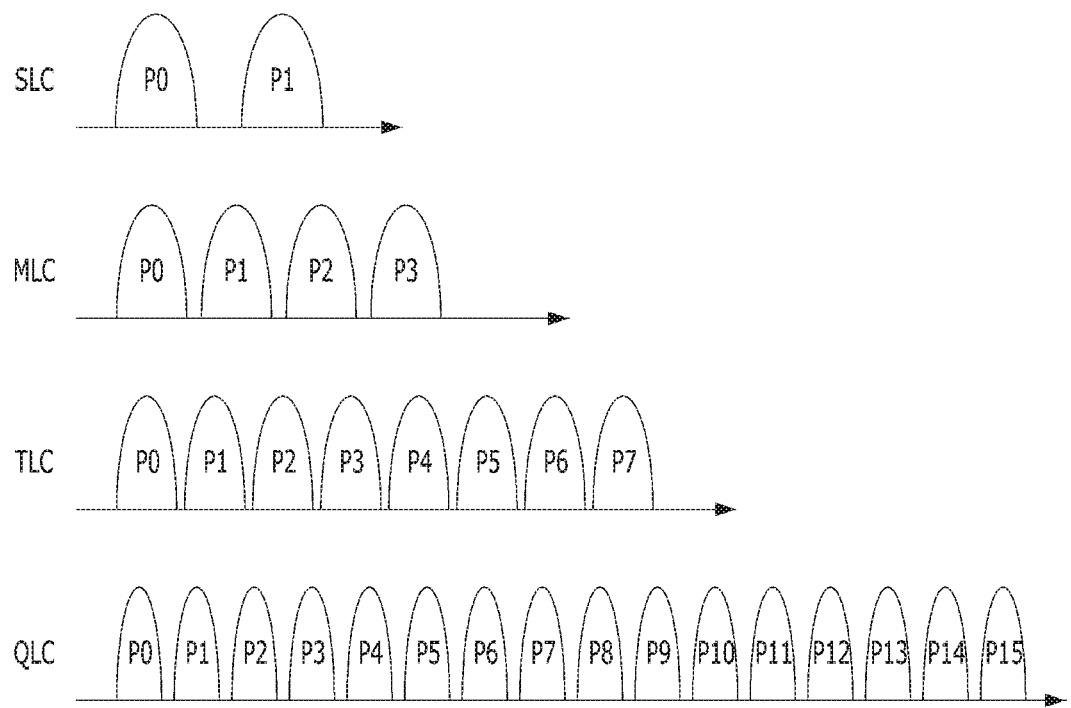
FIG. 4 is a diagram illustrating states for cells of a memory device.

FIG. 4 is a diagram illustrating distributions of program states or voltage levels for different types of cells of a memory device.

Referring to FIG. 4, each of memory cells of the memory blocks may be implemented with a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

Memory cells of SLC may include two states P0 and P1. P0 may indicate an erase state, and P1 may indicate a program state. Since the memory cells of SLC can be set in one of two different states, each of the memory cells may program or store 1 bit according to a set coding method. Memory cells of MLC may include four states P0, P1, P2 and P3. Among these states, P0 may indicate an erase state, and P1 to P3 may indicate program states. Since the memory cells of MLC can be set in one of four different states, each of the memory cells may program or store two bits according to a set coding method. Memory cells of TLC may include eight states P0 to P7. Among these states, P0 may indicate an erase state, and P1 to P7 may indicate program states. Since the memory cells of TLC can be set in one of eight different states, each of the memory cells may program or store three bits according to a set coding method. Memory cells of QLC may include 16 states P0 to P15. Among these states, P0 may indicate an erase state, and P1 to P15 may indicate program states. Since the memory cells of QLC can be set in one of sixteen different states, each of the memory cells may program or store four bits according to a set coding method.

Figure 5:
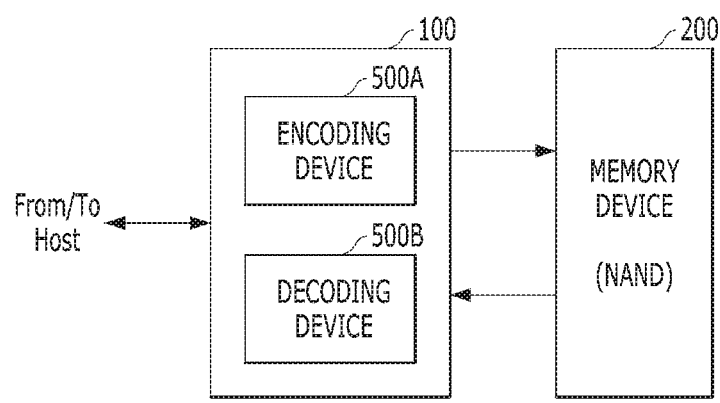
FIG. 5 is a diagram illustrating a memory system in accordance with an embodiment of the present invention.

FIG. 5 is a diagram illustrating a memory system in accordance with an embodiment of the present invention.

Referring to FIG. 5, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoding device 500A, and a decoding device 500B. During the program operation, the encoding device 500A may perform an encoding operation on the write data based on a set encoding scheme. During the read operation, the decoding device 500B may perform a decoding operation on the read data based on a set decoding scheme corresponding to the encoding scheme. The decoding scheme will be described below with reference to FIGS. 6 to 15. The controller 100 and the memory device 200 may perform the operations described in FIGS. 1B and 2. In an embodiment, the encoding device 500A and decoding device 500B may be embodied in the ECC component 130 of the controller 100 shown in FIG. 2. Other suitable arrangements may be employed as well, as explained below. In general, the encoder 500A and decoder 500B may be implemented by hardware, software, firmware, or any suitable combination thereof.

In various embodiments, the decoding device 500B may use low density parity check (LDPC) codes for error-correction in many memory systems such as solid state drives (SSDs) with flash memory for storage.

Figure 6:
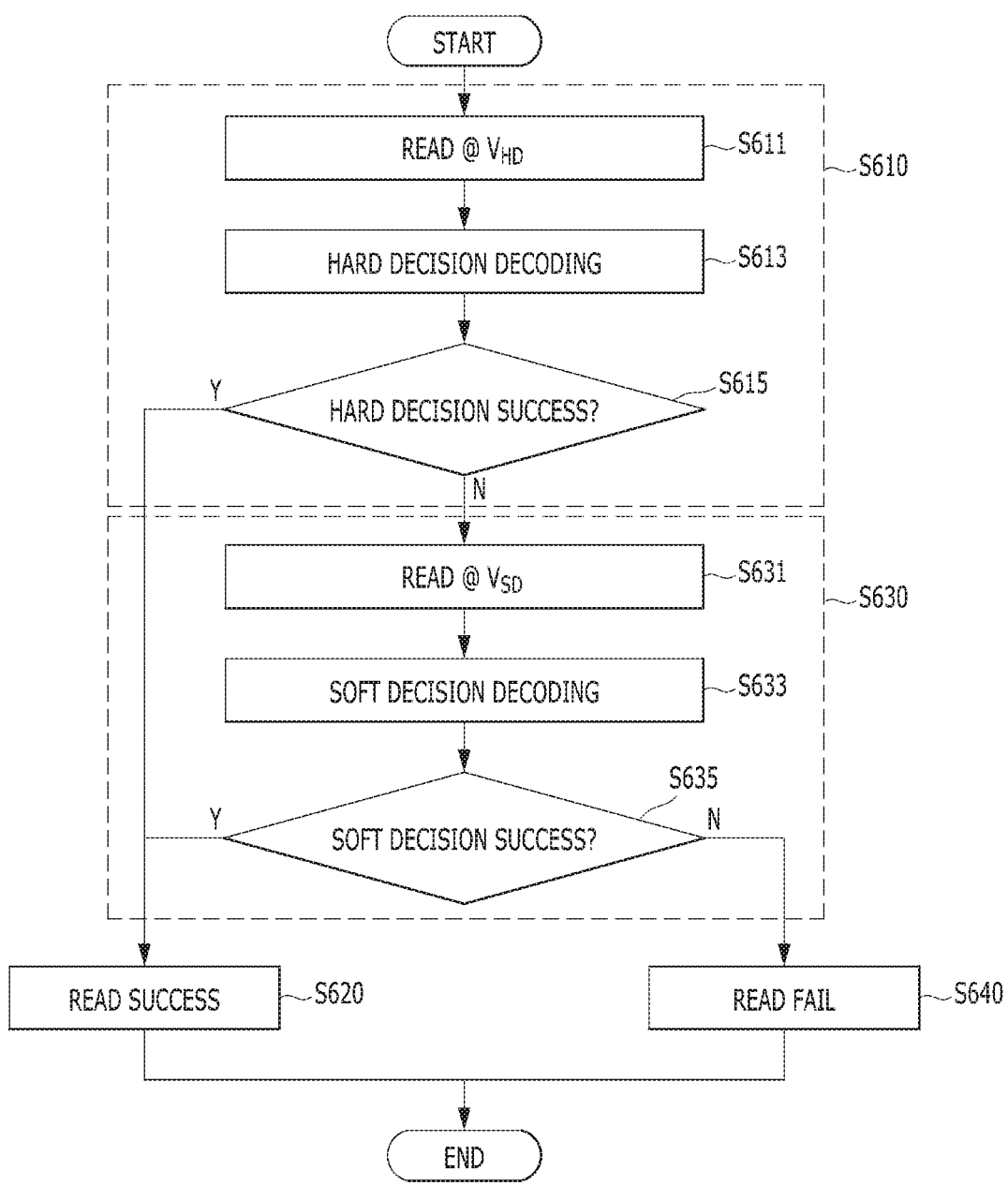
FIG. 6 is a flowchart illustrating a typical low density parity check (LDPC) decoding process.

FIG. 6 is a flowchart illustrating a typical low density parity check (LDPC) decoding process. The typical LDPC decoding process of FIG. 6 may be performed by the decoding device 500B of FIG. 5, which may use sum-product algorithm or min-sum (MS) algorithm.

Referring to FIG. 6, the LDPC decoding process may include a hard decision decoding step S610. Additionally, the LDPC decoding process may include a soft decision decoding step S630. The soft decision decoding step S630 may be performed repeatedly based on the number of read operations and precision information of soft decision read data. Target data of the hard and soft decision decoding steps S610 and S630 may be stored in the memory device 200 of FIG. 5. The data stored in the memory device 200 may be encoded data (or codeword), which is encoded and generated by the encoding device 500A.

The hard decision decoding step S610 may include a hard decision LDPC decoding for read data (or hard decision read data) having a set or predetermined length, which is read from the memory device 200 (i.e., a memory cell of the memory block 211 of FIG. 2) according to a hard decision read voltage $V_{HD}$. The hard decision decoding step S610 may include steps S611, S613 and S615.

The soft decision decoding step 630 may include a soft decision LDPC decoding for read data (or soft decision read data) by forming soft decision read data according to soft decision read voltages $V_{SD}$ around the hard decision read voltage $V_{HD}$ when the hard decision LDPC decoding of the hard decision decoding step 610 finally fails (S615, N). The soft decision read voltages $V_{SD}$ and the hard decision read voltage $V_{HD}$ may be generated by the voltage generation circuit 230 of FIG. 2.

At step S611, data for hard decision (i.e., hard decision read data) may be read from the memory device 200 according to the hard decision read voltage $V_{HD}$. The memory controller 100 may provide a read command and an address to the memory device 200. The memory device 200 may read the read data therefrom according to the hard decision read voltage $V_{HD}$ in response to the read command and the address. The read data may be provided to the memory controller 100.

At step 613, the hard decision decoding (e.g., LDPC decoding) may be performed. The decoding device 500B may perform the hard decision LDPC decoding on the read data using an LDPC code to generate hard decision data.

At step 615, it may be determined whether the hard decision LDPC decoding succeeded or failed. In other words, at step 615, it may be determined whether an error of the hard decision data has been corrected. For example, the decoding device 500B may determine whether an error of the hard decision data has been corrected by using a product result of the hard decision data and a parity check matrix. When the product result is a zero vector ('0'), it may be determined that the hard decision data has been corrected. On the other hand, when the product result is not the zero vector ('0'), it may be determined that the hard decision data has not been corrected.

When it is determined that the hard decision data is corrected (S615, Y), it may be determined at step S620 that the read operation according to hard decision read voltage $V_{HD}$ was successful and the operation of the memory controller 100 may end. The hard decision data may be the error-corrected data through the hard decision LDPC decoding and may be provided to an external device (e.g., the host 5 of FIG. 1A) or used in the memory controller 100.

When it is determined that the hard decision data was not corrected (S615, N), the soft decision decoding step S630 may be performed. The soft decision decoding step S630 may include steps S631, S633 and S635.

Figure 11A:
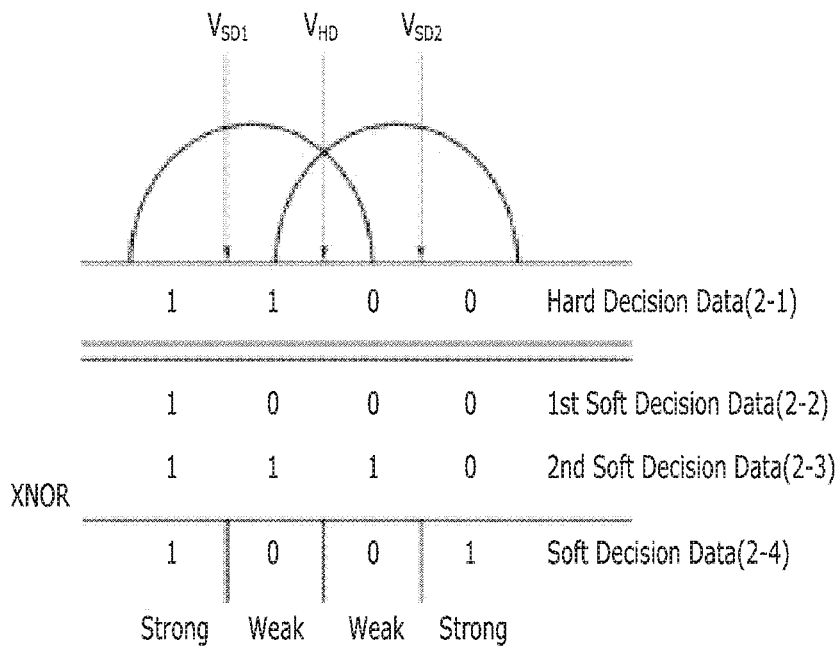
FIGS. 11A and 11B are diagrams illustrating an operation for generating soft decision data by a low density parity check (LDPC) decoding device in accordance with an embodiment of the present invention.
Figure 11B:
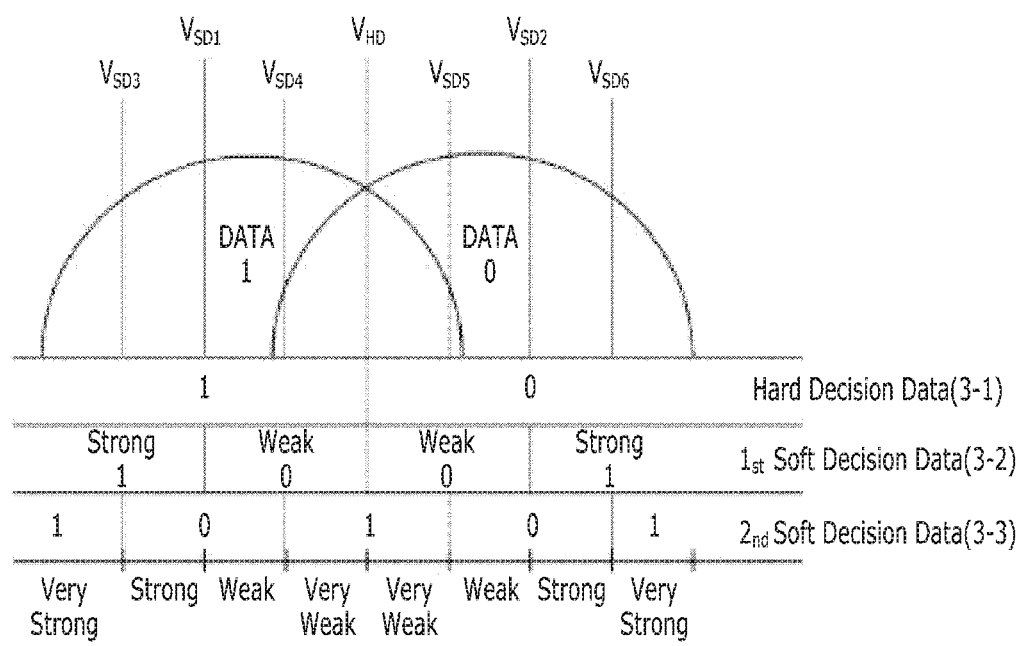

At step 631, data for for soft decision (i.e., soft decision read data) may be read from the memory device 200 according to the soft decision read voltages $V_{SD}$. For example, the additional read operation according to the soft decision read voltages $V_{SD}$ may be performed on the memory cell, to which the hard decision decoding step S610 is performed according to the hard decision read voltage $V_{HD}$. The soft decision read voltages $V_{SD}$ may be different than the hard decision read voltage $V_{HD}$. For example, as shown in FIGS. 11A and 11B, the soft decision read voltages $V_{SD}$ may be greater or less than the hard decision read voltage $V_{HD}$.

At step S633, the soft decision decoding (e.g., LDPC decoding) may be performed. The soft decision LDPC decoding may be performed based on the soft decision read data including the hard decision data, to which the hard decision LDPC decoding is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn−1 of the memory device 200 may belong to one of the threshold voltage distributions including 7 program states P1 to P7 and 1 erase state E.

Figure 10:
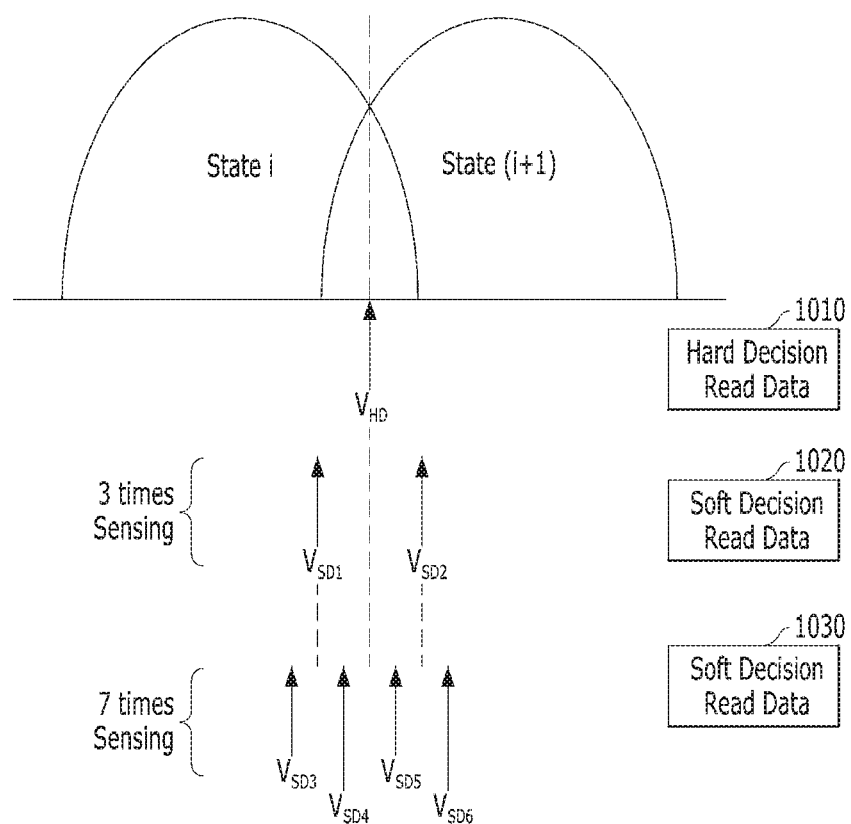
FIG. 10 is a diagram illustrating a data sensing operation by a low density parity check (LDPC) decoding device in accordance with an embodiment of the present invention.

The hard decision read voltage $V_{HD}$ may have a voltage between 2 neighbouring states State (i) and State (i+1) of the plurality of states (e.g., E and P1 to P7), as shown in FIG. 10. Each of the soft decision read voltages $V_{SD}$ may have a voltage between 2 neighbouring states of the plurality of states, which is different from the hard decision read voltage $V_{HD}$.

The hard decision read data read from the memory cells MC0 to MCn−1 according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn−1 or the log likelihood ratio (LLR) providing the certainty or probability associated with the hard decision data may be obtained.

When the additional information is obtained, the log likelihood ratio (LLR), i.e., the probability of whether the data of the memory cells MC0 to MCn−1 belong to the first state (i.e., '1') or the second state (i.e., '0'), may increase. At step S633, the decoding device 500B may perform the soft decision LDPC decoding to generate soft decision data, based on the soft decision read data, which is read according to the hard decision read voltage $V_{HD}$ and the soft decision read voltages $V_{SD}$.

At step S635, it may be determined whether the soft decision LDPC decoding succeeded or failed. In other words, at step S635, it may be determined whether an error of the soft decision data has been corrected. For example, the decoding device 500B may determine whether an error of the soft decision data has been corrected by using the product result of the soft decision data and the parity check matrix. When the product result is the zero vector ('0'), it may be determined that the soft decision data was corrected. When the product result is not the zero vector ('0'), it may be determined that the soft decision read data was not corrected.

When it is determined that the soft decision data is corrected (S635, Y), at step S620, it may be determined that the read operation according to soft decision read voltage $V_{SD}$ at step 631 was successful and the operation of the memory controller 100 may end. The soft decision data now may be the error-corrected data and may be provided externally (e.g., the host 5 of FIG. 1A) or used in the memory controller 100.

When it is determined that the soft decision data was not corrected (S635, N), at step 640, it may be determined that the read operation of the memory controller 100 finally failed and the operation of the memory controller 100 may end.

Figure 7A:
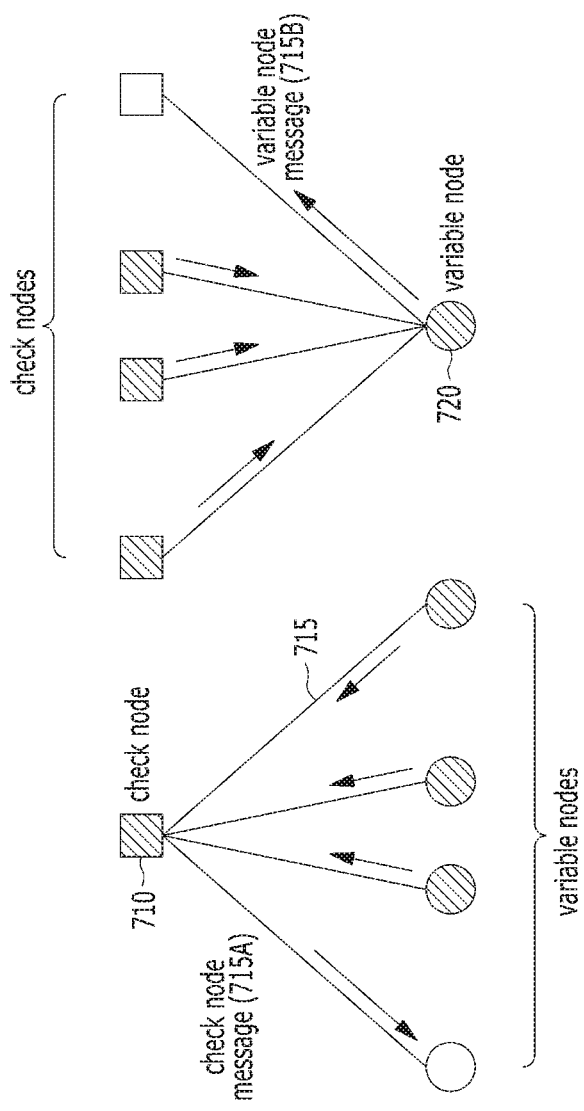
FIG. 7A is a diagram illustrating a low density parity check (LDPC) code represented by a tanner graph.

FIG. 7A is a diagram illustrating a low density parity check (LDPC) code represented by a tanner graph.

Referring to FIG. 7A, the LDPC code may be represented by a tanner graph including check nodes 710, variable nodes 720, and edges 715 connecting the check nodes 710 to the variable nodes 720. A value delivered from one of the check nodes 710 to one of the variable nodes 720 after check node processing becomes a check node message 715A. A value delivered from one of the variable nodes 720 to one of the check nodes 710 after variable node processing becomes a variable node message 715B.

FIG. 7B is a diagram illustrating a structure of a low density parity check (LDPC) code.

Referring to FIG. 7B, the tanner graph for the LDPC code may include a plurality of check nodes 710 (e.g., 5 check nodes C1 to C5), a plurality of variable nodes 720 (e.g., 10 variable nodes V1 to V10) and a plurality of edges 715. The check nodes 710 may represent parity check equations of the LDPC code. The variable nodes 720 may represent code symbols. The edges 715 may represent relationships between the check nodes 710 and the variable nodes 720. The edges 715 may connect each of the check nodes 710 to each of the variable nodes 720 corresponding to a code symbol included in the parity check equations represented by the check nodes 710. By way of example, FIG. 7B illustrates a regular LDPC code in which the number of variable nodes 720 coupled to each of the check nodes 710 is fixed at 4, and the number of the check nodes coupled to each of the variable nodes 720 is fixed at 2. An initial value of each of the variable nodes 720 may be one of the hard decision read data and the soft decision read data. Although FIG. 7B illustrates the regular LDPC code representing 5 check nodes and 10 variable nodes, embodiments of the present invention are not limited to regular LDPC codes.

FIG. 7C is a diagram illustrating a syndrome check process according to a low density parity check (LDPC) decoding.

Referring to FIG. 7C, a parity check matrix H corresponding to the tanner graph of FIG. 7B may be used for the syndrome check process. The parity check matrix H may correspond to the graphic expression of the parity check equations. The parity check matrix H has the same number of logical high values (i.e., "1s") in each column and each row. Here, each column of the parity check matrix H has two logical high values ("1s") and each row has four logical high values ("1s"). That is, the number of 1s in each column corresponds to the number of check nodes coupled to each of the variable nodes 720, which is 2, and the number of 1s in each row correspond to the number of variable nodes 720 coupled to each of the check nodes 710, which is 4.

The LDPC decoding may be performed by an iterative process of exchanging messages, which are generated and updated in each node, between the variable nodes 720 and the check nodes 710 in the tanner graph. In this case, each node updates messages based on the sum-product algorithm or a similar suboptimal algorithm such as min-sum (MS) algorithm.

For example, the LDPC decoding on the hard decision read data may comprise a plurality of iterations, each of which includes update of the check nodes, update of the variable nodes, and a syndrome check after an initial update of the variable nodes. After a single iteration, when the result of the syndrome check satisfies a condition, which may be predetermined, the LDPC decoding may end. When the result of the syndrome check does not satisfy the condition, an additional single iteration may be performed. The additional iteration may include a check node update, a variable node update and the syndrome check. The number of iterations may be limited to a maximum iteration count. When the result of the syndrome check does not satisfy the condition within a certain number of iterations, e.g., a maximum iteration count, the LDPC decoding may be determined to have failed.

In FIG. 7C, the syndrome check process may include a process of identifying whether the product result "$Hv^t$" of the parity check matrix H and a vector "v" satisfies the condition. T vector "v" may be obtained by the update of the variable nodes. When the product result "$Hv^t$" becomes the zero vector, the product result "$Hv^t$" may be evaluated to satisfy the condition.

By way of example, FIG. 7C shows that the product result "$Hv^t$" is a non-zero vector "01000", and thus the syndrome check does not satisfy the condition, which indicates that another iteration is to be performed. In the non-zero vector "01000", which is the product result "$Hv^t$", the number of non-zero vector elements is 1. The number of elements that do not meet the zero vector condition of the syndrome check for the product result "$Hv^t$" in the single iteration may be part of an unsatisfied syndrome check (USC).

Generally, the LDPC decoding such as MS decoding algorithm has a higher correction capability. However, the latency of the read operation may increase linearly with the number of read operations (e.g., NAND sensing operations). Also, the number of sensing operations required may increase exponentially with the number of bits of information. Therefore, it is desirable to improve the LDPC decoding performance to limit the number of NAND sensing operations.

Figure 8:
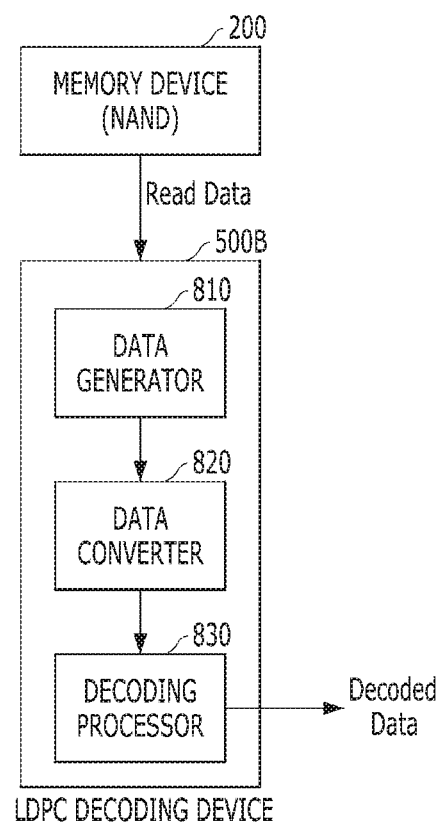
FIG. 8 is a diagram illustrating a low density parity check (LDPC) decoding processor in accordance with an embodiment of the present invention.

FIG. 8 is a diagram illustrating a low density parity check (LDPC) decoding device 500B in accordance with an embodiment of the present invention.

Referring to FIG. 8, the LDPC decoding device 500B may include a data generator 810, a data converter 820 and a decoding processor 830.

The data generator 810 may receive read data from a memory device 200 (e.g., NAND flash memory). The data generator 810 may generate data associated with the read data. For example, the read data includes data for hard decision (i.e., hard decision read data) based on a hard decision voltage $V_{HD}$, or data for soft decision (i.e., soft decision read data) based on soft decision voltages $V_{SD}$, which are described with reference to FIG. 6. The data associated with the read data may indicate a certainty or likelihood associated with decision of the read data.

The data converter 820 may receive the data with a first precision from the data generator 810. The data converter 820 may convert the data with a first precision into a message with a second precision. The second precision may be greater than the first precision. For example, the message includes a bit as a sign for indicating a decision of a value thereof, and remaining bits representing a magnitude of the certainty associated with the decision. In various embodiments, the data converter 820 may include a mapping table for storing the message corresponding to the data. Alternatively, instead of the mapping table, the data converter 820 may include a component for a linear or non-linear converting function to simplify the hardware implementation.

The decoding processor 830 may receive the message from the data converter 820. The decoding processor 830 may perform a low density parity check (LDPC) decoding on the message to generate decoded data.

Figure 9:
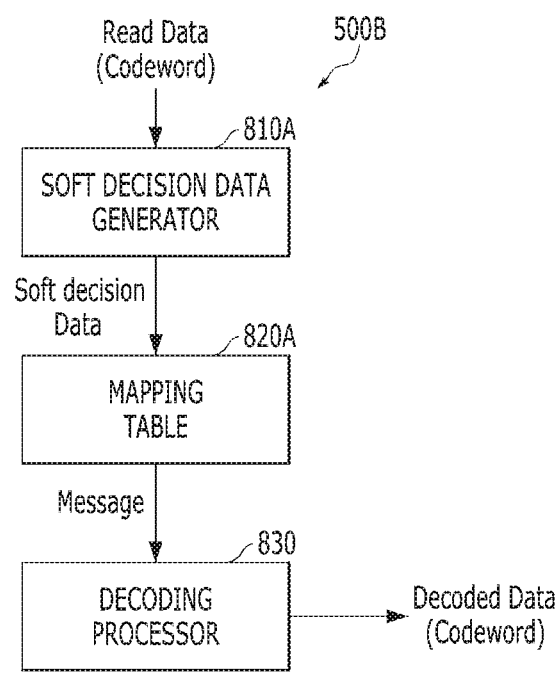
FIG. 9 is a diagram illustrating an example of a low density parity check (LDPC) decoding device in accordance with an embodiment of the present invention.

FIG. 9 is a diagram illustrating an example of a low density parity check (LDPC) decoding device 500B in accordance with an embodiment of the present invention.

Referring to FIG. 9, the LDPC decoding device 500B may include a soft decision data generator 810A, a mapping table 820A and a decoding processor 830. The soft decision data generator 810A and the mapping table 820A may be embodied with or in the data generator 810 and the data converter 820, respectively.

The soft decision generator 810 may receive read data from a memory device 200 (e.g., NAND flash memory). The read data may include a codeword or encoded data, which are generated by the encoding device 500A of FIG. 5 and stored in the memory device 200. The read data may include hard decision read data based on a hard decision voltage $V_{HD}$, or soft decision read data based on soft decision voltages $V_{SD}$, which are described with reference to FIG. 6.

FIG. 10 is a diagram illustrating a data sensing operation by a low density parity check (LDPC) decoding device 500B in accordance with an embodiment of the present invention.

Referring to FIG. 10, in response to a hard decision voltage $V_{HD}$, a select cell of the memory device 200 may be sensed. Then, data for hard decision (i.e., hard decision read data) 1010 may be read from the memory device 200.

When the LDPC decoding for the hard decision read data 1010 fails, soft decision voltages $V_{SD1}$ and $V_{SD2}$ may be generated and provided to the select cell of the memory device 200, and that cell may be sensed again. In other words, the select memory cell may be sensed three times based on the hard decision voltage $V_{HD}$, and the soft decision voltages $V_{SD1}$ and $V_{SD2}$. For example, $V_{HD}$ may be greater than $V_{SD1}$ by a voltage difference and less than $V_{SD2}$ by that same voltage difference. Then, as a result of performing the sensing operation three times (or performing three sensing operations), data for soft decision (i.e., soft decision read data) 1020 may be read from the memory device 200.

When the LDPC decoding for the hard decision read data 1010 and the soft decision read data 1020 fails, soft decision voltages $V_{SD3}$ to $V_{SD6}$ may be generated and provided to the select cell of the memory device 200, and that cell may be sensed. In other words, the select memory cell may be sensed seven times based on the hard decision voltage $V_{HD}$, and the soft decision voltages $V_{SD1}$ to $V_{SD6}$. For example, the soft decision voltage $V_{SD3}$ is less than the soft decision voltage $V_{SD1}$ by a certain voltage difference, the soft decision voltages $V_{SD4}$ is greater than the soft decision voltage $V_{SD1}$ by the same difference, the soft decision voltage $V_{SD5}$ is less than the soft decision voltage $V_{SD2}$ by the same difference, and the soft decision voltages $V_{SD6}$ is greater than the soft decision voltage $V_{SD2}$ by the same difference. Then, as a result of performing the sensing operation seven times (or performing seven sensing operations), data for soft decision (i.e., soft decision read data) 1030 may be read from the memory device 200.

FIGS. 11A and 11B are diagrams illustrating an operation for generating soft decision data by a low density parity check (LDPC) decoding device in accordance with an embodiment of the present invention. FIG. 11A illustrates 2-bit soft decision decoding operation, and FIG. 11B illustrates 3-bit soft decision decoding operation.

Referring to FIG. 11A, during a hard decision decoding operation (e.g., S610 of FIG. 6), hard decision data 2-1 may have one of values '1' and '0' according to an on or off status of a memory cell when the hard decision read voltage $V_{HD}$ is applied to that cell of the memory device 200.

During a 2-bit soft decision decoding operation (e.g., S630 of FIG. 6), soft decision data, i.e., log-likelihood ratio (LLR), may be generated through the soft decision read operation where the soft decision read voltages $V_{SD1}$ and $V_{SD2}$ are applied to the memory cell.

During the 2-bit soft decision read operation, a first soft decision data 2-2 may be '1000' according to the status of a memory cell when the first soft decision read voltage $V_{SD1}$ is applied to the memory cell. In a similar way, a second soft decision data 2-3 may be '1110' according to the status of the memory cell when the second soft decision read voltages $V_{SD2}$ is applied to the memory cell.

For example, the decoding device 500B may generate a soft decision data 2-4 (or LLR) through a certain operation (e.g., XNOR operation) to the first and second soft decision data 2-2 and 2-3. The soft decision data 2-4 may indicate the reliability of the hard decision data 2-1.

For example, a value of "1" in the soft decision data 2-4 may indicate a "strong" or "high" probability that the corresponding value in the hard decision data 2-1 is correct. On the other hand, a value of "0" in the soft decision data 2-4 may indicate a "weak" or "low" probability that the corresponding value in the hard decision data 2-1 is correct.

Referring to FIG. 11B, during a hard decision decoding operation (e.g., S610 of FIG. 6), a hard decision data 3-1 may have one of values '1' and '0' according to the on or off status of the memory cell when the hard decision read voltage $V_{HD}$ is applied to the memory device 200.

During a 3-bit soft decision decoding operation (e.g., S630 of FIG. 6), soft decision data (or LLR) may be generated through the soft decision read operation where the soft decision read voltages $V_{SD1}$ to $V_{SD6}$ are applied to the memory cell.

During the 3-bit soft decision read operation, first and second soft decision read values may be generated according to the status of a memory cell when first and second soft decision read voltages $V_{SD1}$ and $V_{SD2}$ are applied to the memory cell. The decoding device 500B may generate first soft decision data 3-2 (e.g., '1001') (or LLR) through a certain operation (e.g., the XNOR operation) to the first and second soft decision data 2-2 and 2-3 as shown in FIG. 7A. That is, the first soft decision data 3-2 corresponds to the soft decision data 2-4 of FIG. 7A.

In a similar way, during the 3-bit soft decision read operation, third to sixth soft decision read values may be generated according to the status of the memory cell when third to sixth soft decision read voltages $V_{SD3}$ to $V_{SD6}$ are applied to the memory cell. The decoding device 500B may generate second soft decision data 3-3 (e.g., '10101'). The second soft decision data 3-3 may weight or provide more precise probability information with respect to probability information of the first soft decision data 3-2.

For example, a value of "1" in the second soft decision data 3-3 may modifies a corresponding "strong" probability value in the first soft decision data 3-2 to "very strong" or "very high" and modifies a corresponding "weak" probability value in the first soft decision data 3-2 to "very weak" or "very low". On the other hand, a value of "0" in the second soft decision data 3-3 maintains the corresponding probability value.

Thus, the second soft decision data 3-3 modifies the first soft decision data 3-2, and in doing so, may provide a more accurate indication of the reliability of the hard decision data 3-1.

Referring back to FIG. 9, the soft decision data generator 810A may generate data associated with the read data. The read data may be stored in a buffer memory. The soft decision data generator 810A may receive the read data from the memory device 200 through the buffer memory, process the read data and assign the proper reliability value for each bit of the read data (or codeword). The reliability value may indicate how certain the decoding device 500B is in a given decision. In one example, the reliability value is called soft decision data (or soft data, soft information) or log-likelihood ratio (LLR). In other words, the data may be soft decision data indicating a certainty or likelihood associated with the decision of the read data. The soft decision data may have a sign (indicating a result of the decision itself) and have a magnitude representing the degree of certainty of the decision. For example, the sign may indicate a result of a decision (e.g., hard decision) of a bit value (e.g., a positive sign corresponds to a decision that corresponding value is "0", and a negative sign corresponds to a decision that the corresponding value is "1"). The magnitude may indicate how sure or certain the decoding device 500B is in that decision (e.g., a large magnitude indicates a high reliability or certainty, and a small magnitude indicates a low reliability or certainty).

The mapping table 820A may receive the soft decision data with a first precision from the soft decision data generator 810A. The mapping table 820A may convert the soft decision data into a message with a second, higher precision. In one example, the soft decision data includes 3 bits, which provides 2-bit precision, and the message includes 4 bits, which provides 3-bit precision. In another example, the soft decision data includes 3 bits, for 2-bit precision, and the message includes 5 bits, for 4-bit precision. In various embodiments, the mapping table may be optimized offline through simulations or analytically.

Similar to the soft decision data, the message may include a bit for a sign and remaining bits for a magnitude. In other words, the message includes a bit as a sign for indicating a decision of a value thereof, and remaining bits as a magnitude for indicating the certainty associated with the decision.

The decoding processor 830 may receive the message from the mapping table 820A. The decoding processor 830 may perform a low density parity check (LDPC) decoding on the message to generate decoded data (or codeword).

Figure 12:
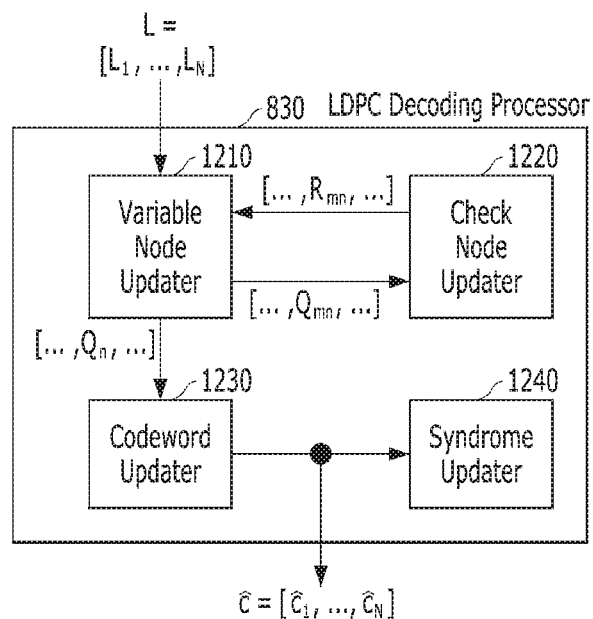
FIG. 12 is a diagram illustrating a low density parity check (LDPC) decoder in accordance with an embodiment of the present invention.

FIG. 12 is a diagram illustrating a low density parity check (LDPC) decoding processor 830 in accordance with an embodiment of the present invention. The LDPC decoder of FIG. 12 corresponds to the decoding processor 830 of FIGS. 8 and 9. For example, the LDPC decoding processor 830 may be used in a memory system and a page or segment containing N cells is read from a memory device (e.g., the memory device 200 of FIG. 5).

Referring to FIG. 12, the LDPC decoding processor 830 may include a variable node updater 1210, a check node updater 1220, a codeword updater 1230 and a syndrome updater 1240.

The variable node updater 302 may generate a message ($Q_{nm}$) which is associated with being sent from variable node n to check node m (e.g., the check node message 715A from variable nodes to check node shown in FIG. 7A). The check node updater 1220 may output message $R_{mn}$ (e.g., the variable node message 715B from check nodes to variable node shown in FIG. 7A).

In the exemplary LDPC decoding processor 830 shown, an array or sequence of N log-likelihood ratio (LLR) values (i.e., $L=[L_1, \ldots, L_N]$) is input by the LDPC decoding processor 830. Each of the LLR values is soft decision data or soft information indicating a sign and a magnitude. The sign may indicate a result of a hard decision of a bit value (e.g., a negative sign (−) indicates a decision of "1" and a positive sign (+) indicates a decision of "0"), The magnitude may indicate the certainty or likelihood associated with that decision (e.g., a larger magnitude corresponds to more certainty in an associated decision).

In addition to generating $Q_{nm}$ messages, the variable node updater 1210 may generate a decoded LLR $Q_n$ for $1 \le n \le N$. The decoded LLR $Q_n$ may be passed from the variable node updater 1210 to the codeword updater 1230.

The codeword updater 1230 may calculate (for $1 \le n \le N$) $\hat{c}=[\hat{c}_1, \hat{c}_2, \ldots, \hat{c}_N]$ using the following:

$\hat{c}_n=0$ if $Qn \ge 0$ $\hat{c}_n=1$ if $Qn<0$

In various embodiments, certain bits (e.g., most significant bits (MSBs)) of the decoded LLR values (i.e., $Q_n$) comprise the decoded sequence (i.e., $\hat{c}=[\hat{c}_1, \hat{c}_2, \ldots, \hat{c}_N]$), so the bits of the decoded LLR values are sent to the syndrome updater 1240 to decide whether decoding is successful or not.

The syndrome updater 1240 may check to see if all of the errors have been removed from the codeword. For example, if for parity check matrix H (e.g., matrix of FIG. 7C), $\hat{c}H=0$, then the syndrome updater 310 determines that decoding is successful and all errors have been removed from the codeword. If so, the LDPC decoding processor 830 stops decoding and outputs $\hat{c}=[\hat{c}_1, \hat{c}_2, \ldots \hat{c}_N]$ as the decoder output.

In some embodiments, if $\hat{c}H \ne 0$, the decoded codeword (i.e., $\hat{c}$) is not output and another decoding iteration is performed until a maximum number of iterations, which may be predefined, is reached. In other words, the variable node updater 1210 calculates new messages $Q_{nm}$ and new values $Q_n$, the check node updater 1220 calculates new messages $R_{mn}$, and the codeword updater 1230 calculates a new codeword and checks if the product of the new codeword and the parity check matrix is 0.

Figure 13:
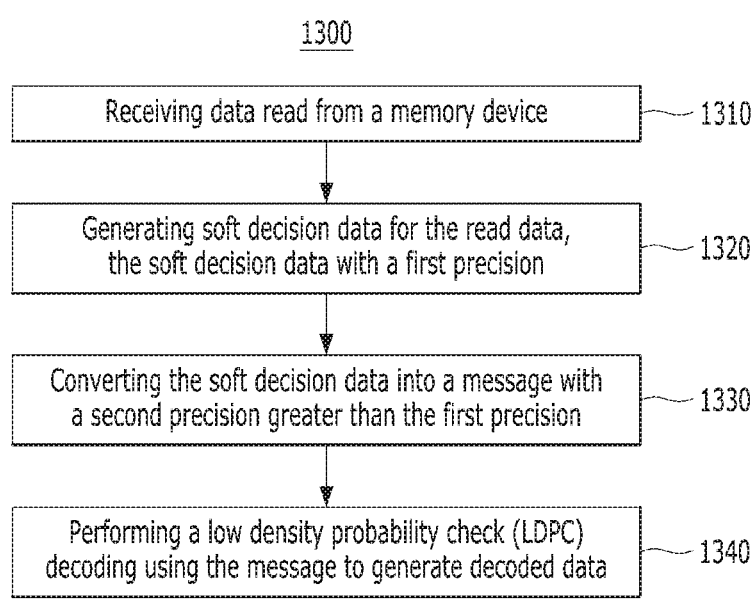
FIG. 13 is a flowchart illustrating a low density parity check (LDPC) decoding method in accordance with an embodiment of the present invention.

FIG. 13 is a flowchart illustrating a low density parity check (LDPC) decoding method 1300 in accordance with an embodiment of the present invention. The LDPC decoding method 1300 may be performed by the LDPC decoding device 500B of FIGS. 8 and 9.

Referring to FIG. 13, the LDPC decoding method 1300 may include steps 1310, 1320, 1330 and 1340. At step 1310, the LDPC decoding device 500B may receive data read from a memory device 200. At step 1320, the LDPC decoding device 500B may generate soft decision data of a first precision for the read data. At step 1330, the LDPC decoding device 500B may convert the soft decision data into a message with a second precision greater than the first precision. At step 1340, the LDPC decoding device 500B may perform the LDPC decoding using the message to generate decoded data.

In various embodiments, the soft decision data indicates a certainty or probability associated with the decision of the read data.

In various embodiments, the converting step 1330 includes converting the soft decision data into the message using a mapping table, which stores the message corresponding to the soft decision data.

In various embodiments, the soft decision data includes a 3-bit codeword, and the message includes a 4-bit codeword.

In various embodiments, the message includes a sign for indicating a decision of a value thereof, and a magnitude for indicating the certainty associated with the decision.

As described above, the LDPC decoding scheme in accordance with embodiments uses higher precision for the messages than for data (i.e., the soft decision data or information) generated by the NAND sensing operations. The LDPC decoding device maps the input soft information to a higher precision representation based on a mapping table.

In other words, the LDPC decoding scheme uses multiple NAND sensing operations for generation of lower precision soft information and an iterative LDPC decoder, e.g., an MS decoder, for generation of internal messages with higher precision. The decoder takes as an input the soft information for each bit of codeword obtained using multiple NAND sensing operations and maps each value of the information to a higher precision value using the mapping table. Thus, the LDPC decoding scheme may improve the LDPC decoding performance by limiting the number of NAND sensing operations.

Figure 14:
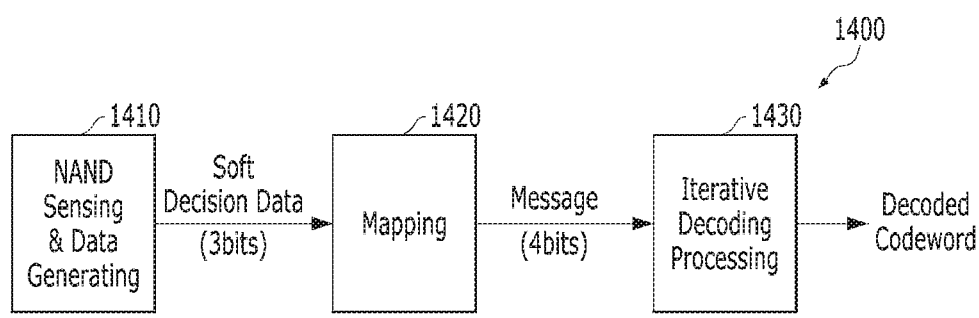
FIG. 14 is a diagram illustrating a process performed by a low density parity check (LDPC) decoding device in accordance with an embodiment of the present invention.

FIG. 14 is a diagram illustrating a process 1400 performed by a low density parity check (LDPC) decoding device in accordance with an embodiment of the present invention, for example, the LDPC decoding device 500B of FIGS. 8 and 9.

Referring to FIG. 14, it is assumed that the NAND sensing operation may be performed 7 times and 3-bit soft decision data (or information) is generated. It is further assumed that the decoding device generates internal messages with a higher precision (e.g., 4-bit). The decoding process 1400 includes generating the 3-bit soft information through the NAND sensing operation (1410). The decoding process 1400 uses a mapping table, which may be predefined, to map or convert the lower precision soft information to the higher precision internal message (1420). This converted message replaces the channel LLR for all iterations of the LDPC decoding processing (1430).

Tables 1 and 2 show examples of a mapping table that maps 2-bit soft information for any code bit to a 3-bit internal message. Note that "b" merely indicates binary and "d" merely indicates decimal. The soft information and the internal message may have a sign (indicating a result of the decision itself) and have a magnitude representing the degree of certainty of the decision. For example, a positive sign corresponds to a decision that corresponding value is "0", and a negative sign corresponds to a decision that the corresponding value is "1". The magnitude may indicate how sure or certain the decoding device 500B is in that decision. The range of the magnitudes of the soft information as the input are 0 to 3 (i.e., d0 to d3). The range of the magnitudes of the internal message as the output are 0 to 7 (i.e., d0 to d7). It is noted that not all values are used in the output column. In other words, some values (i.e., d1, d3, d5 and d6 in Table 1 or d2, d4, d5 and d7 in Table 2) are included in the output of the internal message. Although Tables 1 and 2 illustrate the mapping tables that maps 2-bit soft information for any code bit to a 3-bit internal message, the mapping table that maps 3-bit soft information for any code bit to a 4-bit internal message or a 5-bit internal message may be implemented according to the same principle.

TABLE 1

| | | INPUT (2-bit precision) | | OUTPUT (3-bit precision) | |
|---|---|---|---|---|---|
| | | Binary | Decimal | Binary | Decimal |
| Value | | b11 | d3 | b110 | d6 |
| | | b10 | d2 | b101 | d5 |
| | | b01 | d1 | b011 | d3 |
| | | b00 | d0 | b001 | d1 |

TABLE 2

| | | INPUT (2-bit precision) | | OUTPUT (3-bit precision) | |
|---|---|---|---|---|---|
| | | Binary | Decimal | Binary | Decimal |
| Value | | b11 | d3 | b111 | d7 |
| | | b10 | d2 | b101 | d5 |
| | | b01 | d1 | b100 | d4 |
| | | b00 | d0 | b010 | d2 |

In various embodiments, the mapping table may be obtained using offline simulations to determine values that results in the least codeword failure rate (CFR) or lowest average iterations or any other suitable metric. Alternatively, the mapping table may be replaced by a simpler linear or non-linear function to simplify the hardware implementation.

Figure 15:
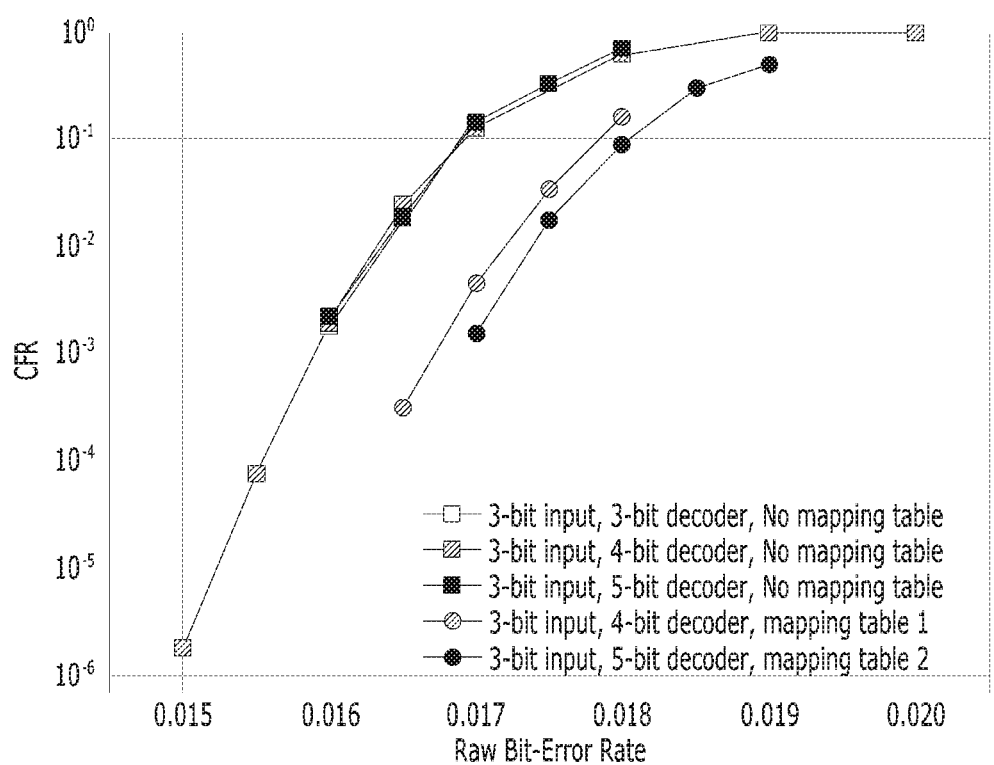
FIG. 15 is a graph illustrating simulations of a low density parity check (LDPC) decoding device in accordance with an embodiment of the present invention.

FIG. 15 is a graph illustrating simulations of a low density parity check (LDPC) decoding device in accordance with an embodiment of the present invention.

By way of example, FIG. 15 illustrates codeword failure rate (CFR) versus raw bit-error rate for the LDPC decoding device for various cases, some with a mapping table and some without. Precision for soft information is 3-bits in all cases. Precision for internal messages of the decoding device varies from 3 to 5 bits. Circle markers denote the LDPC decoding scheme in accordance with embodiments, while square markers denote CFR when soft information is used as-is in the decoding device.

The improvement in CFR when the mapping tables Tables 1 and 2 above are used is evident from the graph in FIG. 15. On the other hand, there is no improvement in the CFR even when the precision of the internal messages is increased from 3 to 4 or 5 if the soft information is not converted using the mapping tables.

As described above, the decoding device in accordance with embodiments uses soft decision data with higher precision, which is converted from lower precision soft decision data corresponding to read data from a memory device, and thus may improve the decoding performance by limiting the number of NAND sensing operations.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A decoding device comprising:
    a data generator suitable for generating information comprised of a first number of bits representing a first precision;
    a data converter suitable for converting the information into a message comprised of a second number of bits representing a second precision greater than the first precision; and
    a decoding processor suitable for performing a low density parity check (LDPC) decoding using the message to generate decoded data.

2. The decoding device of claim 1, wherein the data generator receives read data from a memory device, and generates the information for indicating a certainty associated with a decision of the read data.

3. The decoding device of claim 1, wherein the data converter includes a mapping table storing the message corresponding to the information.

4. The decoding device of claim 1, wherein the information includes a 3-bit codeword.

5. The decoding device of claim 4, wherein the message includes a 4-bit codeword.

6. The decoding device of claim 5, wherein the message has a sign for indicating a decision of a bit value thereof, and a magnitude for indicating the certainty associated with the decision.

7. A memory system comprising:
    a memory device; and
    a memory controller suitable for controlling the memory device to perform a read operation,
    wherein the memory controller includes a decoding device including:
    a data generator suitable for receiving data read from the memory device and generating soft decision data for the read data, the soft decision data comprised of a first number of bits representing a first precision;
    a data converter suitable for converting the soft decision data into a message comprised of a second number of bits representing a second precision greater than the first precision; and
    a decoding processor suitable for performing a low density probability check (LDPC) decoding using the message to generate decoded data.

8. The memory system of claim 7, wherein the data generator includes a soft decision data generator suitable for receiving the read data from the memory device, and generating the soft decision data indicating a certainty associated with a decision of the read data.

9. The memory system of claim 7, wherein the data converter includes a mapping table, which stores the message corresponding to the soft decision data.

10. The memory system of claim 7, wherein the soft decision data includes a 3-bit codeword.

11. The memory system of claim 10, wherein the message includes a 4-bit codeword.

12. The memory system of claim 11, wherein the message has a sign for indicating a decision of a bit value thereof, and a magnitude for indicating the certainty associated with the decision.

13. A method for operating a memory system including a memory device and a memory controller suitable for controlling the memory device to perform a read operation, the method comprising:
    receiving data read from the memory device;
    generating soft decision data for the read data, the soft decision data comprised of a first number of bits representing a first precision;
    converting the soft decision data into a message comprised of a second number of bits representing a second precision greater than the first precision; and
    performing a low density probability check (LDPC) decoding using the message to generate decoded data.

14. The method of claim 13, wherein the generating of the soft decision data for the read data includes generating the soft decision data indicating a certainty associated with a decision of the read data.

15. The method of claim 13, wherein the converting of the soft decision data into the message includes converting the soft decision data into the message using a mapping table, which stores the message corresponding to the soft decision data.

16. The method of claim 13, wherein the soft decision data includes a 3-bit codeword.

17. The method of claim 16, wherein the message includes a 4-bit codeword.

18. The method of claim 17, wherein the message has a sign for indicating a decision of a bit value thereof, and a magnitude for indicating the certainty associated with the decision.

* * * * *